(12) United States Patent
Yin et al.

(10) Patent No.: US 6,727,989 B1
(45) Date of Patent: Apr. 27, 2004

(54) ENHANCED OVERLAY MEASUREMENT MARKS FOR OVERLAY ALIGNMENT AND EXPOSURE TOOL CONDITION CONTROL

(75) Inventors: Xiaoming Yin, Hopewell Junction, NY (US); Christopher Gould, Glen Allen, VA (US); Gerhard Kunkel, Fishkill, NY (US)

(73) Assignee: Infineon Technologies AG, Munich (DE)

(*) Notice: Subject to any disclaimer, the term of this patent is extended or adjusted under 35 U.S.C. 154(b) by 346 days.

(21) Appl. No.: 09/597,123

(22) Filed: Jun. 20, 2000

(51) Int. Cl.$^7$ ............................................... G01B 11/00
(52) U.S. Cl. ........................................ 356/400; 430/22
(58) Field of Search ................................ 356/399–401; 250/48; 430/22

(56) References Cited

U.S. PATENT DOCUMENTS

| | | | |
|---|---|---|---|
| 4,571,538 A | 2/1986 | Chow ........................ 324/699 |
| 4,595,295 A | * 6/1986 | Wilczynski ................. 356/401 |
| 5,087,537 A | 2/1992 | Conway et al. |
| 5,216,257 A | 6/1993 | Brueck et al. |
| 5,438,413 A | * 8/1995 | Mazor et al. ............... 356/400 |
| 5,498,500 A | 3/1996 | Bae ............................ 430/22 |
| 5,738,961 A | * 4/1998 | Chen .......................... 430/22 |
| 5,754,299 A | * 5/1998 | Sugaya et al. .............. 356/401 |
| 5,770,338 A | 6/1998 | Lim et al. .................... 430/22 |
| 5,907,405 A | * 5/1999 | Mizutani et al. ........... 356/399 |
| 5,919,714 A | 7/1999 | Chen et al. |
| 5,989,762 A | 11/1999 | Takaoka ..................... 430/30 |

FOREIGN PATENT DOCUMENTS

EP 0 947 828 A2 10/1999
GB 2 170 005 A 7/1986

OTHER PUBLICATIONS

Flamholz, A.L., et al., "High Resolution Mask Overlay Comparator," IBM Technical Disclosure Bulletin, (Dec. 1978) vol. 21, No. 7, pp. 2839–2844.

Behringer, U., et al., Lithographic Registration Pattern, IBM Technical Disclosure Bulletin, (May 1984) vol. 26, No. 12, pp. 6406–6407.

* cited by examiner

*Primary Examiner*—John R. Lee
*Assistant Examiner*—Christopher M. Kalivoda

(57) ABSTRACT

In an overlay measurement mark comprising an inner box and an outer box located at a predetermined area on a mask through which patterns are formed on a semiconductor device, the improvement of an overlay mark that extends the overlay measurement range comprising: in-focused marks means printed at an optimal or ideal focal plane level from an illumination source, and de-focused marks means located at a different focus level from the optimal focal plane to provide image placement shift of the de-focused marks larger than that of the in-focused marks means to enable measurement of the shift of de-focused marks that are not attributable to a mechanical alignment error to be determined with greater accuracy.

5 Claims, 2 Drawing Sheets

ENHANCED OVERLAY MEASUREMENT MARKS FOR OVERLAY ALIGNMENT AND EXPOSURE TOOL CONDITION CONTROL

BACKGROUND OF THE INVENTION

1. Field of Invention

The invention relates to overlay control in semiconductor processing, and in particular, a method of providing enhanced overlay measurement marks for control in semiconductor processing to overcome the limitations of overlay measurements marks that give an overlay shift range comparable to the measurement tools uncertainty and gives only stepper or scanner mechanical alignment errors but fails to provide accurate image placement error information due to stepper or scanner exposure conditions.

2. Description of Prior Art

In general, an overlay measurement mechanism is utilized in measuring an overlay error between multi patterns on a semiconductor body of a particular pattern formed by photolithographic techniques. The photolithographic technique entails the exposure of the surface of a semiconductor body or chip to a particular pattern, and the subsequent formation or development of that pattern into a permanent form through the use of wet or dry etching techniques that create various regions and structures on the surface of the semiconductor body or chip.

It is known that photolithographic procedures require the employment of masks to define those portions of the semiconductor material where various elements of semiconductor devices are to be located. Different parts or elements of the semiconductor devices must be located at precisely defined distances from one another, and it is desirable that each of the mask used in forming the semiconductor devices be aligned with respect to one another as precisely as possible, both in vertical and horizontal directions.

One method of determining alignment as well as the extent of processing is done visually by an operation that examines the surface of the semiconductor wafer and the mask under a microscope. The use of marks on the masks and on the wafer facilitates the monitor or measurement of misalignment. In any event, visual measurement procedures are very time consuming and subject to human errors. Further, a large number of measurements across the wafer from wafer to wafer are very difficult and in large scale production processes it is desirable to obtain a statistical base of information on the quantity and relative alignment of elements across the wafer from a large number of processed wafers.

U.S. Pat. No. 4,571,538 disclose a method for affecting mass alignment measurement structure during semiconductor fabrication by quantitatively measuring the relative alignment of elements on a surface of a semiconductor formed by two sequential masking steps during processing, wherein a fixed pattern of rectangular images are formed on a first mask, and a fixed pattern of repeating U-shaped images are formed on a second mask. The semiconductor material is processed so that the rectangular images on the first mask align with the U-shaped images on the second mask, whereupon an electrical probe is applied to opposed ends of the boustrophederal pattern formed and the electrical resistance measured to determine a parameter related to relative alignment of elements on the semiconductor.

A method of producing a semiconductor device utilizing an alignment correcting method is disclosed in U.S. Pat. No. 5,989,762, wherein a designated number of wafers are selected out of a single lot to have their alignment marks measured in terms of coordinates. Thereafter, a preselected number of wafers are selected out of the wafers having undergone measurement in the descending order with respect to closeness to a mean value or a center value of scattering, exposed and then developed. An alignment correction value is calculated on the basis of developed wafers.

U.S. Pat. No. 5,438,413 disclose a process for measuring overlay misregistration during semiconductor wafer fabrication. The method of inspecting the semiconductor wafer utilizes precision optical inspection methods and apparatus and performs microscopic measurement of alignment between at least two process layers on integrated circuit wafers using a coherence probe microscope in combination with electronic image processing. Data obtained from different planes is then used to calculate the magnitude and phase of the mutual coherence between an object wave and a reference wave for each pixel in the image planes, and synthetic images are formed, the brightness of which is proportional to either the complex magnitude or the phase of the mutual coherence as the optical path length is varied. The difference between synthetic images relating to target attribute position and bullet attribute position is then used as a means for detecting misregistration between the processing layer including the bullet attribute and the processing layer including the target attribute.

A method for measuring an overlay error between multiple patterns in a semiconductor device is disclosed in U.S. Pat. No. 5,48,500. The process entails forming a first overlay measurement pattern on a first selected portion of a scribe line by a first mask formed considering the margin between the first mask pattern and a second mask pattern, with the first overlay measurement pattern consisting of two patterns spacing parallel to each other. A second overlay measurement pattern is formed on a second selected portion of the scribe line by a second mask which is formed considering the margin between the second mask pattern and a third mask pattern so as not to superimpose the first overlay measurement pattern, with a second overlay measurement patterns consisting of two patterns spacing parallel to each other. Thereafter, a third overlay measurement pattern is formed on the scribe line by a third mask which is used to form the third mask pattern, with the third overlay measurement pattern forming at the center of the inside of the first and second overlay measurement patterns. The distance between the first overlay measurement patterns and the third overlay measurement patterns, and the distance between the second overlay measurement patterns and the third overlay measurement patterns are then measured to ascertain the error between the multi patterns in the semiconductor device.

A phase shifting overlay mark that measures exposure energy and focus during an alignment process forming a pattern of a semiconductor device is disclosed in U.S. Pat. No. 5,770,338. The overlay mark includes an inner box and an outer box to concurrently measure exposure energy and focus, wherein the changes of the exposure energy and the focus are represented by a phase shift between the inner and outer boxes in the X-axis and Y-axis.

There is a need in the art of measuring overlay misregistration or overlay alignment to: extend the overlay measurement range; increase the accuracy of overlay measurement results; and provide results in controlling stepper overlay alignment as well as scanner exposure conditions.

SUMMARY OF THE INVENTION

One object of the present invention is to extend the overlay measurement range during manufacturing or fabrication of semiconductor devices.

A further object of the present invention is to increase the accuracy of overlay measurement results during fabrication of semiconductor devices.

A further object of the present invention is to provide results for controlling stepper overlay alignment as well as stepper exposure conditions during manufacturing of semiconductor devices.

In general, the invention overlay measurement mark and method of measuring an overlay error between multiple patterns in a semiconductor device that overcomes the uncertainty of overlay shift range that is comparable to the measurement tools, and the limitation that gives only stepper or scanner mechanical alignment error and does not provide accurate image placement error information due to stepper or scanner exposure conditions is accomplished by providing overlay measurement marks in which a pair of resist/arc stacks are printed on a prior level located at a different focus level from the conventional level overlay measurement marks, and additionally, providing different feature marks placed along the conventional marks. The feature sizes of the marks are similar to those used in the device region, and due to this configuration, feature size dependent image placement errors can be determined with a higher degree of accuracy. The invention may be accomplished with various types of mask. In the case of phase shift mask the de-focused marks can be implemented differently, in that, instead of printing the marks on the previous level, the marks are implemented on the current level mask using different phase shifts (0° to 90° C.) on the two sides of the mark.

DESCRIPTION OF THE PREFERRED EMBODIMENTS

Overlay control is very critical in semiconductor processing, and this is especially true since industry momentum is aggressively shrinking the design rules to reaching beyond 135 nm. Further, at present, the overlay budget for production of advance products is rapidly approaching the overlay measurement tools uncertainty. In addition, stepper or scanner exposure conditions, i.e., lens aberration, light source coherence, and the focus window induce overlay errors that are significant obstacles as part of the overall overlay budget or cost.

Further, the current box-in-box overlay measurement mark schemes have the following limitations:

1) it gives an overlay shift range that is comparable to the measurement tools uncertainty; and
2) it cannot separate stepper or scanner mechanical alignment errors from image placement error due to stepper or scanner exposure conditions.

The present invention overlay measurement mark schemes have been devised to solve the existing problems of overlay measurement mark schemes that give an overlay shift range comparable to the measurement tools uncertainty, and to overcome the fact that current box-in-box overlay measurement marks schemes give only stepper or scanner mechanical alignment error that does not provide accurate image placement error information due to stepper or scanner exposure conditions.

Figure 1:
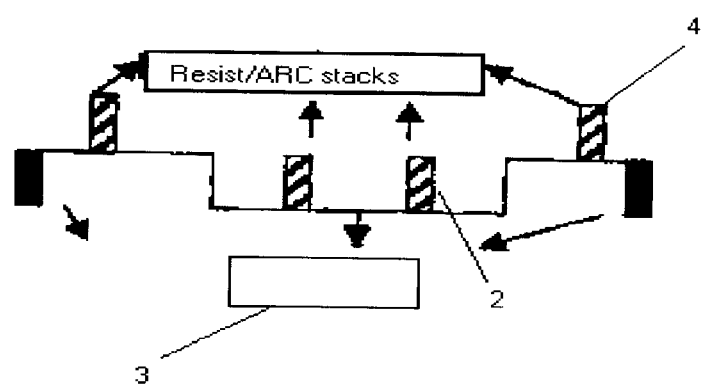
FIG. 1 is a schematic diagram showing overlay measurement marks in which a pair of resist/arc stacks are printed on a prior level which is located at a different focus level from the current level overlay measurement marks.

Reference is now made to FIG. 1 in which there is shown a schematic diagram that illustrates cross-sections of a box-in-box overlay measurement marks scheme in which a pair of resist/arc stacks 2 are printed on a prior level 3 which is located at a different focus level from the conventional current level overlay measurement marks 4. Generally, the conventional marks 4 are printed at an optimal focal plane and the pair of marks 2 are printed at a fixed distance off the ideal focal plane. Depending upon lens aberration and exposure conditions, the image placement shift of marks 2 is larger than that of marks 4, thereby allowing the shifts of marks 2 to be measured with greater accuracy for the same given measurement uncertainty.

Figure 2:
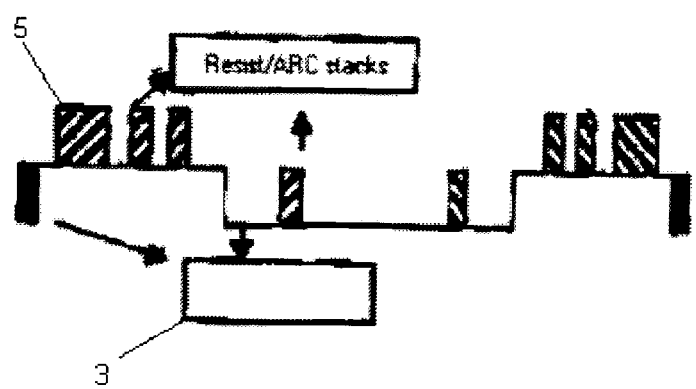
FIG. 2 is a schematic diagram showing overlay measurement marks in which, in addition to the scheme in FIG. 1, shows different feature size marks placed along with the conventional marks. The feature sizes of the marks are similar to those used in the device region, and in this configuration feature size dependent image placement error can be ascertained.

In FIG. 2, there is shown a schematic diagram of the invention overlay mark schemes in which the illustration utilizes a cross-section of a box-in-box overlay measurement marks scheme. FIG. 2, in addition to the overlay measurement mark schemes shown in FIG. 1 shows additional different feature size marks 5 placed along the conventional mark. The feature sizes of the different marks are similar to those used in the semiconductor device region and in this configuration, feature size dependent image placement errors can be determined.

The enhanced overlay measurement marks for overlay alignment and exposure tool condition control illustrated in FIGS. 1 and 2 can be implemented with various types of masks. For phase shift mask the de-focused marks 2 can be implemented differently in that, instead of printing the de-focused marks on the prior level, they are implemented on the current level mask using different phase shifts (0° to 90° C.) on the two sides of the marks. An example is given in FIG.3.

Figure 3:
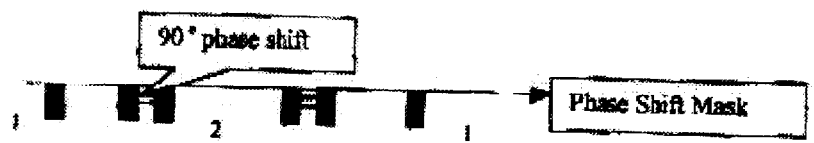
FIG. 3 is a schematic diagram for the schemes of FIGS. 1 and 2 implemented with a phase shift mask, wherein the de-focused marks may be implemented differently, in that instead of printing the marks on the previous level, they are implemented on the current level mask using different phase shifts (0° to 90° C.) on the two sides of the mark.
Figure 4:
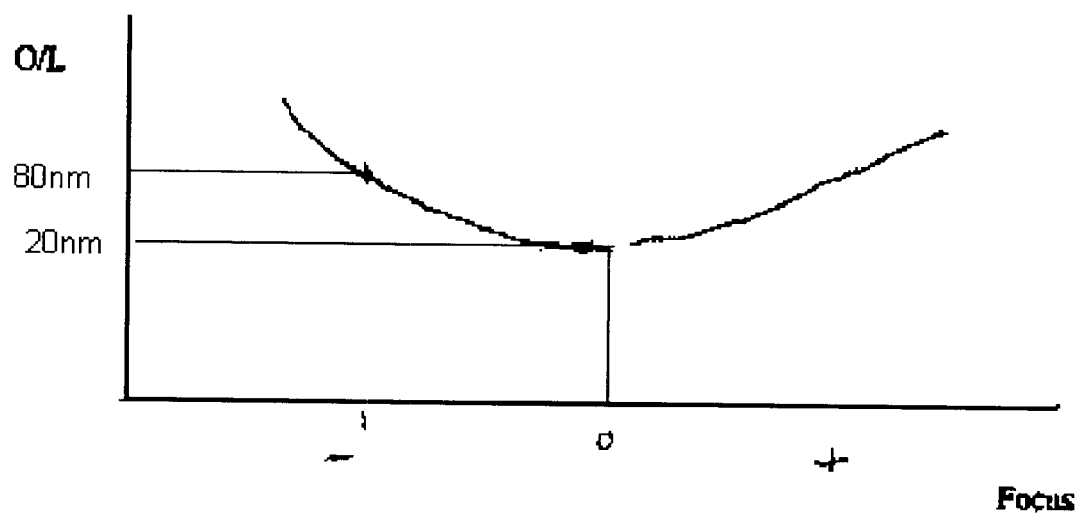
FIG.4 shows an aerial image of the pattern from FIG. 3 indicating the distribution of light intensity formed on a focal plane by a mask when a process of exposing a positive photoresist film is performed using the mask of FIG. 3.

In FIG. 4 an aerial image of an overlay (O/L) error pattern is shown indicating the distribution of light sensitivity formed on a focal plane by a mask when the process of exposing a positive photoresist film is performed using a mask such as that shown in FIG.3.

The overlay error (O/L) may be determined by use of a second order polynomial as follows:

$$O/L \text{ error} = a + b \times \text{Focus} + c \times \text{Focus}^2$$

Two marks at Fixed Focus distance (2 and 4 labeled above)

$$\text{Focus}(4) = f_0 + \text{Focus}(2)$$

$$O/L \text{ error}(2) = a + b \times \text{Focus}(2) + c \times \text{Focus}^2(2)$$

$$O/L \text{ error}(4) = a + b \times \text{Focus}(4) + c \times \text{Focus}^2(4)$$

Subtract $\Delta$ error $= b \times f_0 + c \times (\text{Focus}(2) + f_0)^2 - c \times \text{Focus}^2(2)$ Focus(2)=

As the overlay control becomes very critical in semiconductor processing due to the demand for smaller devices containing more detail and the ever aggressively shrinking design rule reaching beyond 135 nm, the normal stepper or mechanical part of the overlay misalignment (which is normally the major part) then shifts to the matter of overlay error as a function of focus or questions of lens aberration, light source coherence and focus window. The present invention enables assessment of overlay measurement marks utilizing a scheme that accomplishes the following objectives: utilizing the de-focused marks to produce a larger overlay shift, thereby resulting in obtaining measurements with greater accuracy to enable determination from the results to serve as an early out of control warning signal; utilizing different feature size marks placed across reticle field locations (4×4) to provide estimations of actual device feature image placement errors; and use of the combination of in-focus marks, de-focused marks, and/or, different feature size marks to provide means for monitoring not only mechanical alignment but also exposure conditions, and utilizing the results of these measurements in searching for overlay error sources and thereby speeding up the error correction process.

From FIG. 4 it may be seen from the parabolic curve that, when the focus is 0°, since the overlay error is a function of focus, the overlay error is best or less. As the focus moves away from 0° the overlay error (whether negative or positive) is greater, thereby allowing overlay error to be more accurately ascertained by assessing what fraction of the error is caused by the focus.

While the present invention has been particularly shown and described with reference to particular embodiment thereof, the present invention is not confined to the above-described embodiment. Moreover, it will be understood by those skilled in the art that various changes in form and detail may be effected therein without departing from the spirit and scope of the invention as defined by the appended claims.

We claim:

1. In an overlay measurement mark comprising an inner box and an outer box located at a predetermined area on a mask through which patterns are formed on a semiconductor device, the improvement of an enhanced overlay measurement mark that extends the overlay measurement range to overcome the limitations of overlay measurement marks that give an overlay shift range comparable to the measurement tools uncertainty and gives only stepper or scanner mechanical alignment errors but fails to provide accurate image placement error information due to stepper or scanner exposure conditions comprising:

in-focused marks means printed at an optimal or ideal focal plane level from an illumination source;

de-focused marks means located at a different focus level from the optimal focal plane to provide image placement shift of said de-focused marks larger than that of said in-focused marks means to enable measurement of the shift of de-focused marks not attributable to a mechanical alignment error to be determined with greater accuracy; and different feature size marks means placed across reticle field locations to provide estimations of actual device feature image placement errors.

2. The enhanced overlay measurement mark of claim 1 wherein said in-focused marks means are a pair of in-focused marks and said de-focused marks means are a pair of de-focused marks.

3. The enhanced overlay measurement mark of claim 2 wherein said pair of de-focused marks means are printed at a fixed distance off said ideal focal plane.

4. The enhanced overlay measurement mark of claim 1 wherein said improvement of the overlay mark that extends the overlay measurement range is a change in focus represented by a phase shift between said inner and outer boxes.

5. The enhanced overlay measurement mark of claim 4 wherein said phase shift ranges from 0° to 90°.

* * * * *

UNITED STATES PATENT AND TRADEMARK OFFICE
CERTIFICATE OF CORRECTION

PATENT NO. : 6,727,989 B1  Page 1 of 1
DATED : April 27, 2004
INVENTOR(S) : Yin et al.

It is certified that error appears in the above-identified patent and that said Letters Patent is hereby corrected as shown below:

<u>Column 2,</u>
Line 30, "5,48,500" should be -- 5,498,500 --

Signed and Sealed this

Fifteenth Day of June, 2004

JON W. DUDAS
*Acting Director of the United States Patent and Trademark Office*